(12) United States Patent
Lerner et al.

(10) Patent No.: US 6,907,178 B2
(45) Date of Patent: Jun. 14, 2005

(54) OPTOELECTRONIC ASSEMBLY WITH EMBEDDED OPTICAL AND ELECTRICAL COMPONENTS

(76) Inventors: Steve Lerner, 221 Brook St., Carlisle, MA (US) 01742; Claudio Truzzi, 44 rue Vert-Vinave, Vottem (BE), 4041

( * ) Notice: Subject to any disclaimer, the term of this patent is extended or adjusted under 35 U.S.C. 154(b) by 0 days.

(21) Appl. No.: 10/459,338

(22) Filed: Jun. 11, 2003

(65) Prior Publication Data

US 2003/0231833 A1 Dec. 18, 2003

Related U.S. Application Data

(60) Provisional application No. 60/388,437, filed on Jun. 13, 2002.

(51) Int. Cl.⁷ .................................. G02B 6/10
(52) U.S. Cl. ..................... 385/131; 385/14; 333/247
(58) Field of Search ............... 385/131.14, 48, 385/49, 88–89; 333/247

(56) References Cited

U.S. PATENT DOCUMENTS

| | | | | |
|---|---|---|---|---|
| 5,510,758 A | * | 4/1996 | Fujita et al. ............ | 333/247 |
| 5,611,008 A | * | 3/1997 | Yap ....................... | 385/14 |
| 5,761,350 A | * | 6/1998 | Koh ....................... | 385/14 |
| 5,880,657 A | * | 3/1999 | Dorschky et al. ........ | 333/246 |
| 5,909,523 A | * | 6/1999 | Sakaino et al. .......... | 385/49 |
| 6,027,254 A | * | 2/2000 | Yamada et al. .......... | 385/88 |
| 6,164,836 A | * | 12/2000 | Yamada et al. .......... | 385/88 |
| 6,222,967 B1 | * | 4/2001 | Amano et al. ........... | 385/49 |
| 6,264,377 B1 | * | 7/2001 | Mitsuda et al. ......... | 385/88 |
| 6,343,164 B1 | * | 1/2002 | Robertsson et al. ..... | 385/14 |
| 6,438,281 B1 | * | 8/2002 | Tsukamoto et al. ..... | 385/14 |
| 6,456,767 B2 | * | 9/2002 | Terashima .............. | 385/49 |
| 6,477,302 B2 | * | 11/2002 | Tatoh .................... | 385/49 |
| 6,509,641 B2 | * | 1/2003 | Tateoka et al. .......... | 257/700 |
| 6,553,173 B1 | * | 4/2003 | Goto ...................... | 385/137 |
| 6,585,426 B2 | * | 7/2003 | Shuto et al. ............ | 385/90 |
| 6,611,635 B1 | * | 8/2003 | Yoshimura et al. ...... | 385/14 |
| 6,640,021 B2 | * | 10/2003 | Pogge et al. ............ | 385/14 |
| 6,657,523 B2 | * | 12/2003 | Tarui et al. ............. | 333/246 |
| 2002/0037138 A1 | * | 3/2002 | Kaneko et al. .......... | 385/49 |
| 2003/0019838 A1 | * | 1/2003 | Shaw et al. ............. | 216/20 |
| 2003/0108269 A1 | * | 6/2003 | Pogge et al. ............ | 385/14 |

* cited by examiner

Primary Examiner—Ellen E. Kim
(74) Attorney, Agent, or Firm—Aliki K. Collins; AKC Patents, LLC

(57) ABSTRACT

The invention provides an optoelectronic assembly for coupling an optical conductor to a light emitting surface of an optoelectronic semiconductor device on a substrate. The optoelectronic assembly includes a multilayer having a cavity adapted to receive and electrically connect the optoelectronic semiconductor device to the multilayer substrate and a groove leading to the cavity and being adapted to receive and optically connect the optical conductor to the light emitting surface of said optoelectronic semiconductor device. The optoelectronic semiconductor device and the optical conductor are precisely positioned within the cavity and the groove, respectively, so that light emitted from the light emitting surface of the optoelectronic semiconductor device couples to an optical surface of the optical conductor.

33 Claims, 6 Drawing Sheets

OPTOELECTRONIC ASSEMBLY WITH EMBEDDED OPTICAL AND ELECTRICAL COMPONENTS

CROSS REFERENCE TO RELATED CO-PENDING APPLICATIONS

This application claims the benefit of U.S. provisional application Ser. No. 60/388,437 filed on Jun. 13, 2002 and entitled INTEGRATED OPTOELECTRONIC ASSEMBLY WITH EMBEDDED OPTICAL AND ELECTRICAL COMPONENTS which is commonly assigned and the contents of which are expressly incorporated herein by reference.

FIELD OF THE INVENTION

The invention relates to an optoelectronic assembly, and more particularly, to an optoelectronic assembly with embedded optical and electrical components on a substrate.

BACKGROUND OF THE INVENTION

There are many methods for manufacturing optoelectronic assemblies that include integrated optical and electrical devices and components on a substrate. The optical and electrical devices and components may be among others optical fibers, lenses, mirrors, light emitting diodes, laser diodes, photodiodes, detectors, semiconductor devices, capacitors, inductors and resistors.

Several prior art methods utilise silicon "V-grooves" as fiber positioning elements. U.S. Pat. No. 4,767,174 makes use of the fact that certain crystalline orientations of silicon substrates can be preferentially etched to a high degree of accuracy. This is accomplished by a series of lithographic steps including resist coating and exposure, followed by liquid etching. This is an expensive method, which is not compatible with standard microelectronic infrastructures and processes.

Alternatively, the V-groove and optical fiber can be positioned relative to a waveguide by using additional positioning elements. These positioning elements also increase the complexity and cost of the method. Even when the V-groove technique is utilised only to couple two optical fibers to one another, as in U.S. Pat. No. 4,973,126, there are several additional positioning elements required.

U.S. Pat. No. 4,735,677 describes a method for providing guides for aligning optical fibers on the surface of a silicon substrate. In this method it is necessary to first grow a layer of glass on the silicon wafer by a soot process. This layer of glass is then lithographically patterned and etched, as by reactive ion etching (RIE), to form the positioning elements. After formation of these elements, an optical fiber can be inserted between them and fixing is accomplished with an adhesive or by melting the glass with a CO.sub.2 laser beam. This technique involves a great number of processing steps and is limited to substrates that are not damaged by high temperature processes or those that do not contain sensitive electronic devices that would be damaged by an RIE etch.

U.S. Pat. No. 4,750,799 teaches a hybrid optical integrated circuit having a high-silica glass optical waveguide formed on a silicon substrate, an optical fiber and an optical device coupled optically to the optical waveguide, and an optical fiber guide and an optical device guide on the substrate for aligning the optical fiber and the optical device at predetermining positions, respectively, relative to the optical waveguide. Islands carrying electrical conductors are disposed on the substrate, a first electrical conductor film is formed on the substrate, second electrical conductor films are formed on the top surfaces of the optical waveguide, the optical fiber guide, the optical device guide and the islands and are electrically isolated from the first electrical conductor film.

U.S. Pat. No. 4,796,975 teaches a method of aligning and attaching optical fibers to substrate optical waveguides. One or more slabs of preferentially etchable material and a waveguide substrate are placed adjacent to each other face down on a flat surface for aligning the tops of the slabs with the top of the waveguide. A backing plate is secured to the back surface to hold the entire assembly together. The preferentially etchable material is etched to form V-grooves in alignment with the light guiding region of the waveguide substrate. Optical fibers are secured within the groove and are optically aligned with the light guiding region.

U.S. Pat. No. 5,359,687 teaches an optical coupling device having a substrate with a surface region at a predetermined position on the surface of the substrate for placing an optical waveguide. The substrate further includes a channel on its surface for optically aligning and coupling an optical fiber to an optical waveguide positioned at the predetermined position. The longitudinal axis of the channel is in alignment with the predetermined position such that on placement of the optical fiber in the channel and placement of the optical waveguide in the position the light carrying core of the fiber and the waveguide are substantially in optical alignment.

U.S. Pat. No. 6,266,472 describes a process of splicing optical fibers having of a substrate and at least one optical fiber gripper on the substrate. The gripper includes adjacent parallel, polymeric strips each having a base attached to a surface of the substrate, a top surface in a plane parallel to the substrate, and side walls, which form a groove between adjacent strips. The invention provides strips of polymeric splice elements, also known as elastomeric polymer grippers, to provide a splice means for optical fibers. Once these grippers are deposited on a substrate, optical fibers can be snapped between them. The splicing elements allow for accurate lateral and longitudinal alignment and improved collinearity of spliced optical fibers, achieving low coupling loss.

U.S. Pat. No. 6,371,655 provides a molded plastic housing that incorporates a device and other optical elements including an optical fiber and lenses. The device may be a transmitter. The entire housing assembly may be connected to another similar assembly housing a receiver. The transmitter package may be mounted side-by side in another plastic housing.

U.S. Pat. No. 6,285,808 and U.S. Pat. No. 6,324,328 provide a circuit carrier having an optical polymer layer embedded between layers of insulating or conducting materials. The circuit carrier structure including the optical layer is formed by conventional laminating processes.

U.S. Pat. No. 6,376,268 provides an optoelectronic assembly having an insulating substrate with a planar surface and a metal layer bonded to the planar surface. The metal layer is patterned and adapted to receive active and passive optical components. Structures formed in the metal layer (i.e., steps) are utilized as fiduciaries for positioning of the optical components. Furthermore there is an optical fiber placed into a groove and attached to the substrate.

U.S. Pat. No. 5,875,205 and U.S. Pat. No. 6,271,049 describe an optoelectronic assembly having active optical components (i.e., a laser chip) and passive optical components (i.e., a lens) integrated onto a substrate.

None of these prior art methods teach how to accurately position and align optical fibers and other optical and electrical devices on a substrate. There is a need for an assembly and a method for accurately positioning and aligning of optical components such as fibers, optical waveguides, and semiconductor devices on a substrate. The invention further needs to compactly integrate optical and electrical passive and active structures within the same coupling platform. The invention further needs to provide means for optimising the assembly of a complete optoelectronic component, and not only one of its constituents. The invention also needs to make use of standard processes and materials currently used in the microelectronics and microelectromechanical systems industries, allowing for large-scale manufacturing at reduced cost, while still improving the accuracy and repeatability of the assembly.

SUMMARY OF THE INVENTION

The invention provides an assembly and a method for accurate placing and aligning active and passive devices and components on a substrate by precise patterning of an optical polymer layer formed on the substrate and adapted to receive the mentioned devices.

In general, in one aspect, the invention provides an optoelectronic assembly for coupling an optical conductor to a light emitting surface of an optoelectronic semiconductor device. The optoelectronic assembly includes a multilayer substrate having a cavity adapted to receive and electrically connect the optoelectronic semiconductor device to the multilayer substrate and a groove leading to the cavity and being adapted to receive and optically connect the optical conductor to the light emitting surface of the optoelectronic semiconductor device. The optoelectronic semiconductor device and the optical conductor are precisely positioned within the cavity and the groove, respectively, so that light emitted from the light emitting surface of the optoelectronic semiconductor device couples to an optical surface of the optical conductor.

Implementations of this aspect of the invention may include one or more of the following features. The multilayer substrate may further include first and second sets of patterned layers. The first set of patterned layers may include at least one metal layer, at least one dielectric layer, and a plurality of passive electrical components embedded within the patterned layers and connected to each other and to the metal layer thereby forming an electrical network. The second set of patterned layers may be formed upon the first set of patterned layers, and it may include at least one polymeric layer. The polymeric layer may include the cavity and the groove. The cavity may include a first opening formed in a cavity wall. The optoelectronic semiconductor device is oriented and positioned within the cavity so that light emitted from the light emitting surface exits the cavity via the first opening. The groove may include a second opening formed in a groove wall. The second opening is aligned with the first opening, thereby allowing light exiting the cavity through the first opening to couple to an optical surface of the optical conductor aligned with the second opening. The optoelectronic semiconductor device is precisely positioned within the cavity in X and Y directions by placing two adjacent walls of the device in contact with two adjacent walls of the cavity. The optoelectronic semiconductor device may further be precisely positioned within the cavity in a Z direction by placing a bottom surface of the device upon a bottom surface of said cavity. The optoelectronic semiconductor device may further be precisely positioned within the cavity in a Z direction at a predetermined height by placing a bottom surface of the device upon a first spacer positioned upon a bottom surface of the cavity and having the predetermined height. The cavity wall having the first opening may be spaced apart the groove wall having the second opening by a predetermined distance by placing a second spacer between the cavity wall and the groove wall. The second spacer has a length equal to the predetermined distance. The optoelectronic semiconductor device may be a laser diode, a light emitting diode, a photodiode or a light detector. The optical conductor may be an optical fiber, an optical waveguide, a lens, a mirror, a grating, a diffraction element, or combinations thereof. The first set of patterned layers may have a height in the range between 10 micrometers and 25 micrometers. The polymeric layer may a height in the range between 30 micrometers and 150 micrometers. The optoelectronic semiconductor device may be flip chip mounted or wire bonded within the cavity. The cavity may include at least one metal contact and the metal contact may be in contact with the metal layer and with the optoelectronic semiconductor device thereby electrically connecting the optoelectronic semiconductor device to the metal layer. The first and second spacer may be made of a polymer.

In general, in another aspect, the invention features a method of coupling an optical conductor to a light emitting surface of an optoelectronic semiconductor device. The method includes the following steps. First, providing a multilayer substrate having first and second sets of patterned layers. The first set of patterned layers includes at least one metal layer and at least one dielectric layer and the second set of patterned layers includes at least one polymeric layer. Next, forming a cavity within the at least one polymeric layer. The cavity is adapted to receive and electrically connect the optoelectronic semiconductor device to the metal layer. Next, forming a groove within the polymeric layer. The groove leads to the cavity and is adapted to receive and optically connect the optical conductor to the light emitting surface of the optoelectronic semiconductor device. Finally, precisely positioning the optoelectronic semiconductor device and the optical conductor within the cavity and the groove, respectively, so that light emitted from the light emitting surface of the optoelectronic semiconductor device couples to an optical surface of the optical conductor.

Implementations of this aspect of the invention may include one or more of the following features. The method may further include forming a first opening in a cavity wall and positioning the optoelectronic semiconductor device within the cavity so that light emitted from the light emitting surface exits the cavity via the first opening. The method may further include forming a second opening in a groove wall, wherein the second opening is aligned with the first opening, thereby allowing light exiting the cavity through the first opening to couple to an optical surface of the optical conductor aligned with the second opening. The positioning of the optoelectronic semiconductor device within the cavity in X and Y directions includes placing two adjacent walls of the device in contact with two adjacent walls of the cavity. The precise positioning of the optoelectronic semiconductor device within the cavity in a Z direction includes placing a bottom surface of the device upon a bottom surface of the cavity. The precise positioning of the optoelectronic semiconductor device within the cavity in a Z direction at a predetermined height may also include placing a bottom surface of the device upon a first spacer formed upon a bottom surface of the cavity and having the predetermined height. The method may further include placing apart the cavity wall that has the first opening from the groove wall that has the second opening by a predetermined distance by forming a second spacer between the cavity wall and the groove wall. The second spacer has a length equal to the predetermined distance.

Among the advantages of this invention may be one or more of the following. The invention provides an assembly and a method for aligning, coupling and fixing elements allowing accurate lateral and longitudinal alignment upon a planar substrate. The invention offers the advantages of reduced thickness of the assembly, higher placement accuracy, easier automation and large-scale manufacturability with reduced cost. The positioning and fixing of the elements on the substrate are manufactured with standard microelectronic processing techniques, which offer a higher accuracy and repeatability in large-scale production than conventional approaches.

DETAILED DESCRIPTION OF THE INVENTION

Figure 1:
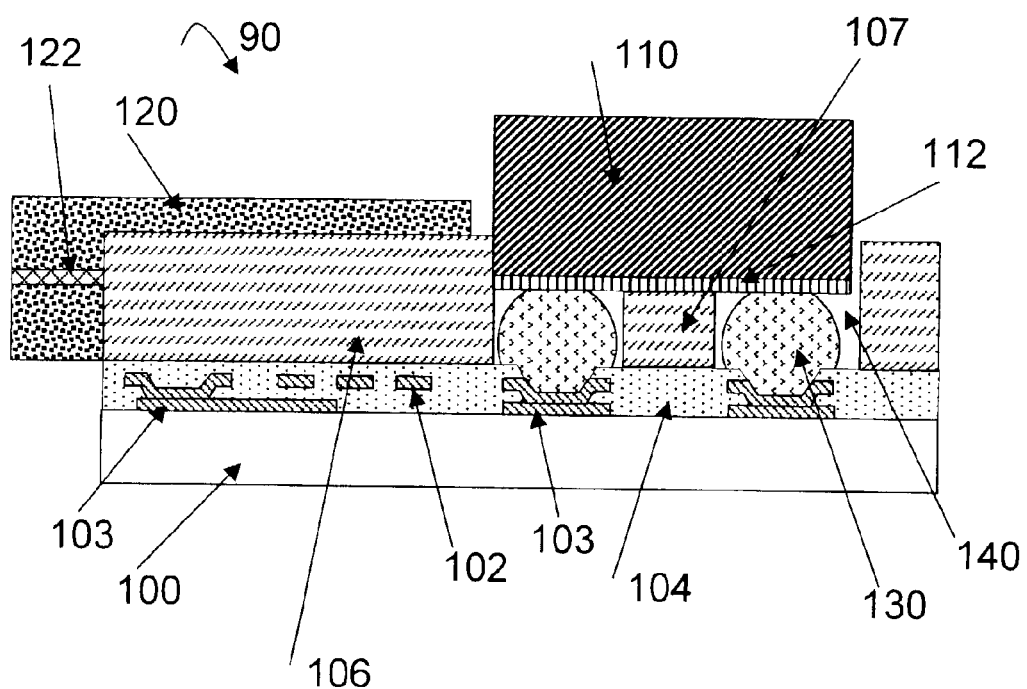
FIG. 1 is a side, cross-sectional view of the integrated optoelectronic assembly showing embedded electrical components, the thick polymeric material, the optical fiber, and a flip chip mounted semiconductor die connected with solder bumps to the underlying metal pads.

Referring to FIG. 1, the optoelectronic assembly 90 includes a carrier substrate 100, a dielectric layer 104 with embedded patterned metal layers 102, 103, and a polymeric layer 106. Dielectric layer 104 is positioned on top of the carrier substrate 100 and the polymeric layer 106 is positioned on top of the dielectric layer 104. The thickness of the carrier substrate 100 and the dielectric layer 104 is in the range of 10 to 20 micrometers. The thickness of the polymeric layer 106 varies between 30 and 150 micrometers. The assembly 90 further includes a semiconductor die 110, connected to the patterned metal layers 103 via metal bonding pads 130. In a preferred embodiment the semiconductor die 110 is flipchip mounted into a cavity 140 formed within the polymeric layer 106. The semiconductor die 110 may be an edge emitting laser, photodiode or other semiconductor optical devices. The polymeric layer is patterned to include a groove 150, stoppers 108 (shown in FIG. 3), cavity 140, and spacers 107. Groove 150 is adapted to receive a fiber 120 and stoppers 108 are used for positioning of the fiber 120 so that it is aligned with the light emitting edge of the semiconductor die 110. The walls of the cavity 140 are used for x-y positioning of the semiconductor die 110 and the spacer 107 is used for z-positioning of the semiconductor die.

Figure 3:
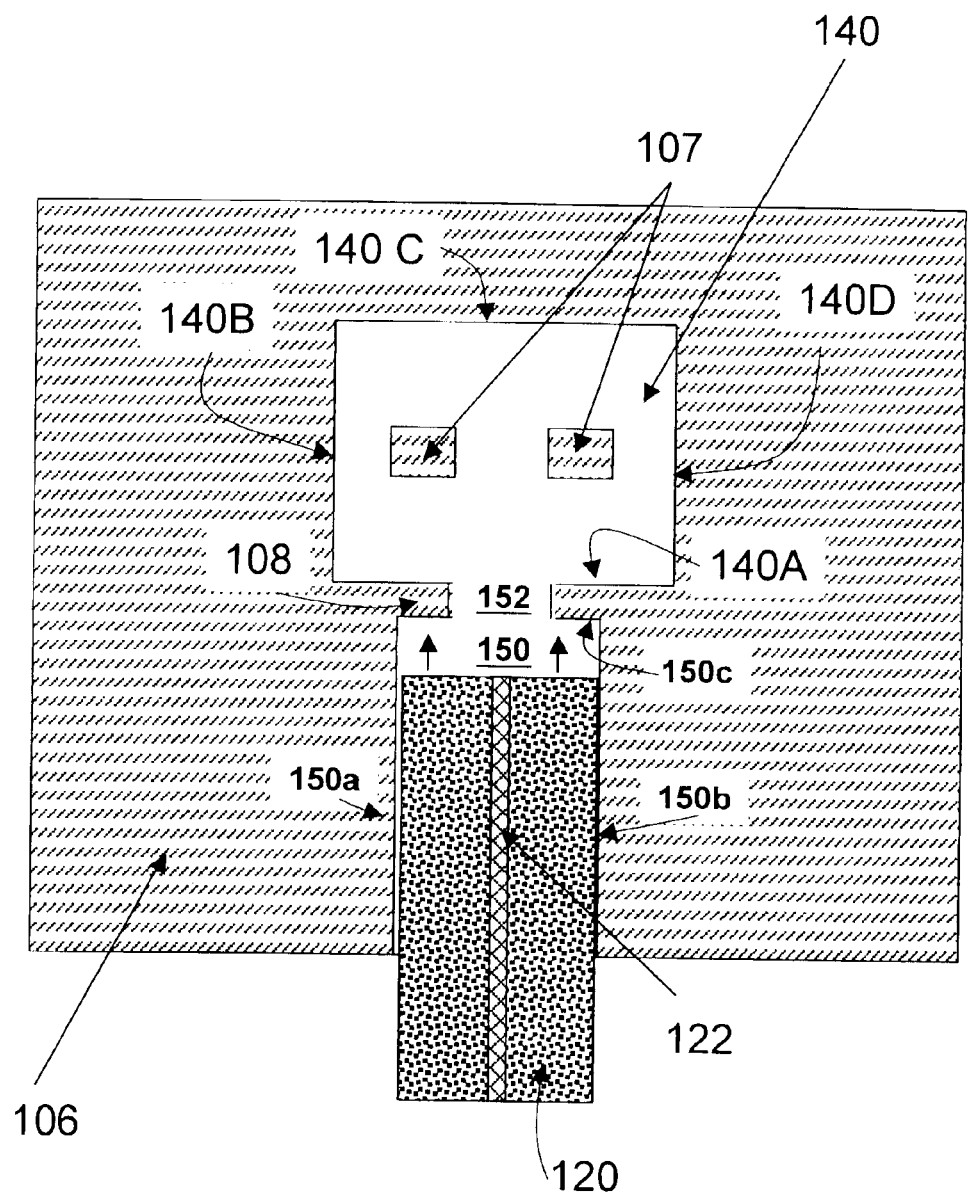
FIG. 3 is a top view of the optoelectronic assembly of FIG. 1 showing the positioning of the optical fiber within the polymeric groove.
Figure 4:
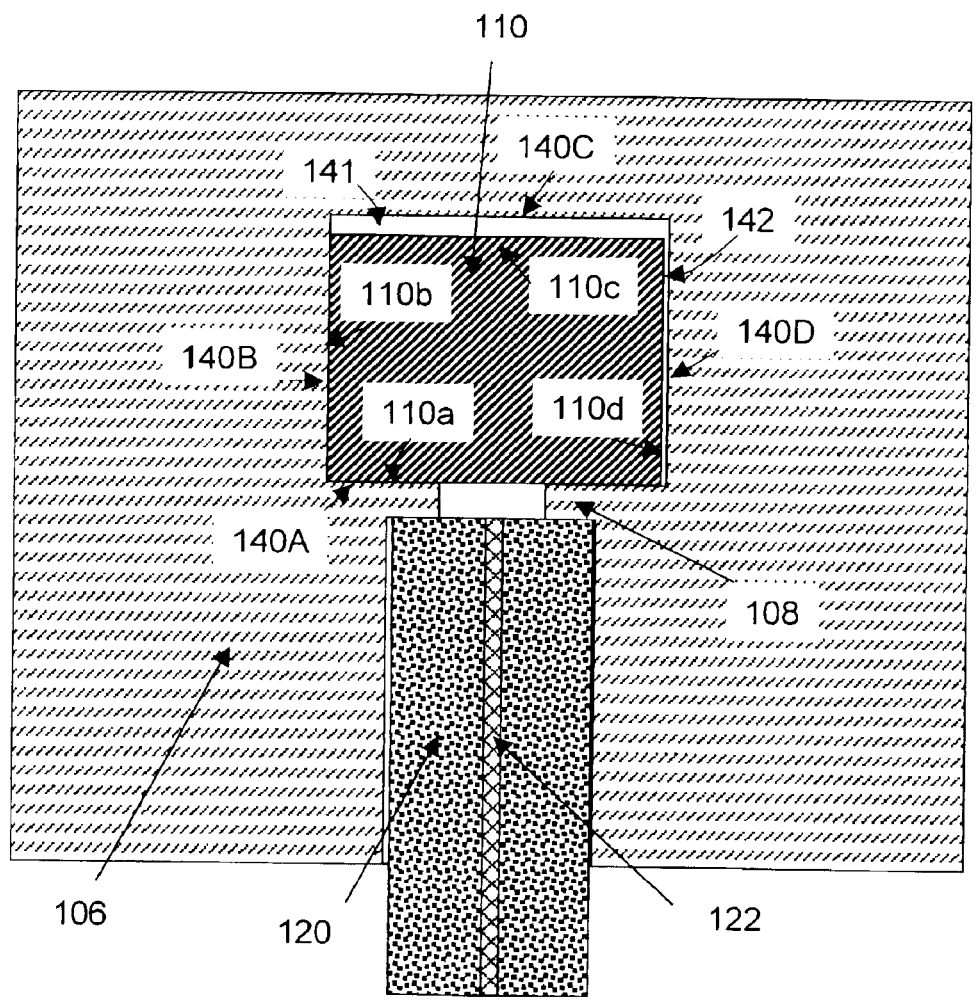
FIG. 4 is a top view of the optoelectronic assembly of FIG. 1, showing the optical fiber and the die positioned and fixed in their final configuration.

Referring to FIGS. 3 and 4, the semiconductor die 110 is placed upside down into the cavity 140 and onto the spacers 107. For the x-y positioning of the semiconductor die 110, two adjacent and vertical to each other sides of the semiconductor die 10a, 10b are placed in contact with the cavity walls 140A and 140B. This positioning of the die leaves spaces 141, 142 between the other two semiconductor die sides 110c, 110d and the cavity walls 140C, 140D, respectively. The spacing 141, 142, between the die 110 and the cavity walls 140C, 140D accommodate any thermal expansions that may occur during the operation of the device and allow the use of materials with different thermal expansion coefficients. The z-positioning of the semiconductor die 110 is determined by the thickness of the polymeric spacers 107. The final relative positioning of the fiber 120 and the die 110 are therefore defined by design, using microelectronic processes, which exhibit a much greater accuracy and reproducibility than a mechanical assembly. The accuracy of the placement in the present assembly is of the order of micrometers.

Figure 2:
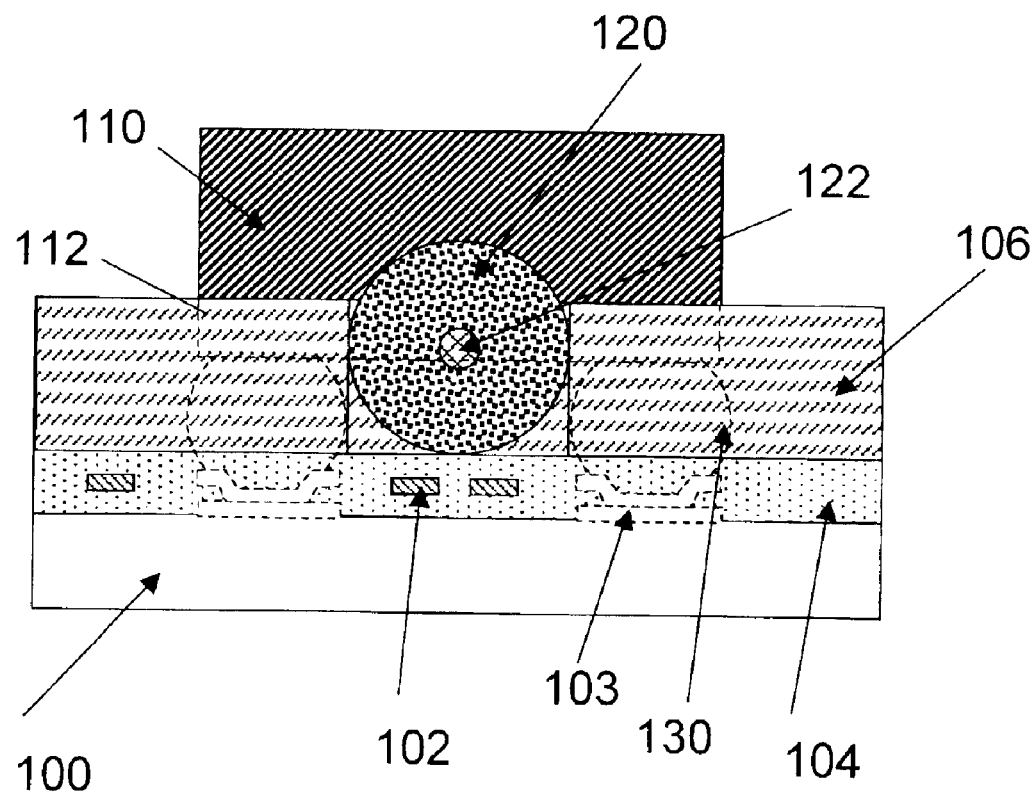
FIG. 2 is a front, cross-sectional view of the optoelectronic assembly of FIG. 1.

The carrier substrate 100 has a high quality surface finishing on at least its top side. In the preferred embodiment depicted in FIG. 1, two subsequent layers of metals 102, 103 are deposited and patterned, alternated with two layers of high planarity, low moisture absorption, low dielectric constant and low loss dielectric material 104. If only one set of metal-dielectric layers is used, only interconnection traces and bond pads can be manufactured. If two sets of metal-dielectric layers are used, traces, pads, inductors and low-value capacitors can be integrated. If more than two sets of metal-dielectric layers are deposited, resistors and high value capacitors can be included. By alternating several layers of dielectric material with different refractive indices, optical waveguides can be integrated as well. The overall thickness of this first set of layers ranges typically between 10 micrometers and 25 micrometers. This first set of layers is sufficiently planar to allow the further deposition and patterning of a thicker set of layers of polymeric material 106, ranging from about 30 micrometers to about 150 micrometers. This polymeric material can be deposited and patterned in one single step, or in a series of steps, in case different heights are required. As depicted in FIG. 1, a first height of the polymeric material 106, referenced as polymer spacer 107, is used to accurately define the vertical positioning of the semiconductor die 110. A second height of the polymeric material 106 is used to create sufficiently high walls 150a, 150b (shown in FIG. 3) forming groove 150 used to guide the optical fiber 120 into its final position. The relative vertical positioning of the optical fiber 120 and the semiconductor die 110 is such that the fiber core 122 is accurately aligned with the edge of the active surface 112 of the die 110 (shown in FIG. 2). This embodiment is suitable for aligning optical fibers with edge emitting lasers or edge receiving photodiodes or other semiconductor optical devices.

Referring again to FIG. 3, a third wall 150c of the groove 150, transverses the two polymeric walls 150a, 150b, and is patterned so that it exhibits a through slot 152 in the middle and two side portions 108. Side portions 108 act as fiber stoppers, precisely defining the final position of the fiber. The middle slot 152 allows the light to couple to and from the optical fiber. The groove 150 has a rectangular cross-section that provides sufficient space for absorbing the excess of the glue used for fixing the fiber in place. By manufacturing thicker fiber stoppers 108, tapered fibers can be accurately positioned as well. The cavity 140 is shown with 4 sides 140A, 140B, 140C and 140D. Within the cavity, two die spacers 107 are shown.

FIG. 4 shows the same top view with all elements in their final positions. The fiber 120 is placed against stoppers 108 and the semiconductor die 110 is placed upside down into the cavity 140 and onto the spacers 107, and is mounted in such a way that it is pressed against the cavity sides 140A and 140B, leaving some space 141, 142 between the other two die edges and cavity sides 140C and 140D, respectively. The cavity 140 is therefore not symmetrically placed relative to the fiber guide axis. In this way, cavity sides 140A and 140B are used to accurately position the semiconductor die into its final, predefined position.

Figure 5:
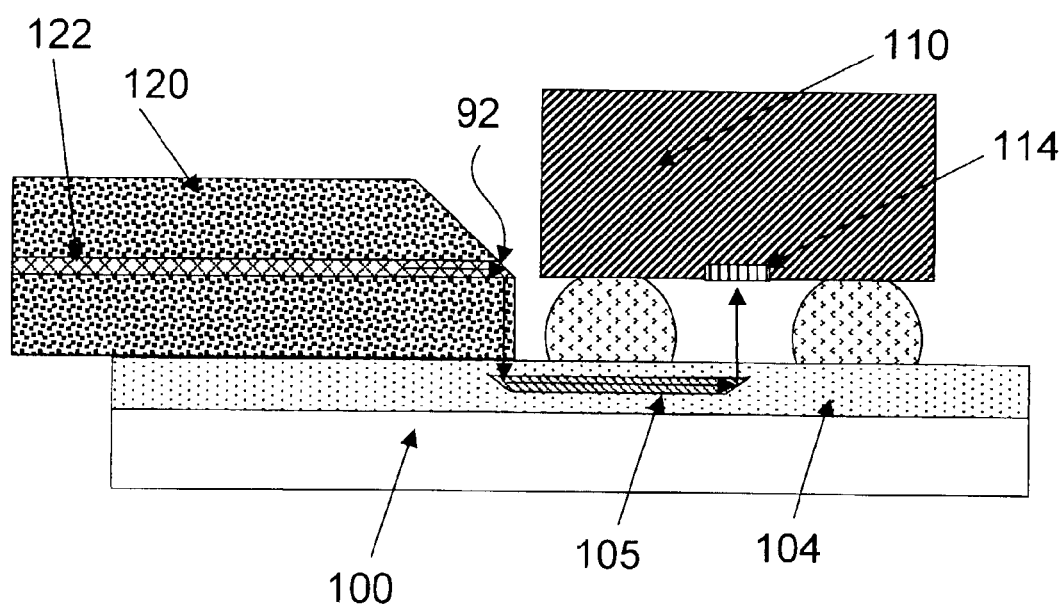
FIG. 5 is a side view of another embodiment of the optoelectronic assembly.

Referring to FIG. 5, another preferred embodiment includes an optical fiber 120 whose tip 92 has been cleaved to allow for a total internal reflection of the light beam, according to industry accepted techniques. The light beam is subject to a 90° angle reflection and travels through the fiber cladding, through the optical quality glue, through the top part of the dielectric material 104 and hits the tip of the embedded optical waveguide 105, which causes the light to be reflected forward and then again upward at the end of the waveguide, until the beam hits the light sensitive portion 114 on the active surface of the semiconductor device 110. The inverse path is applicable in case of a transmitter device.

Figure 6:
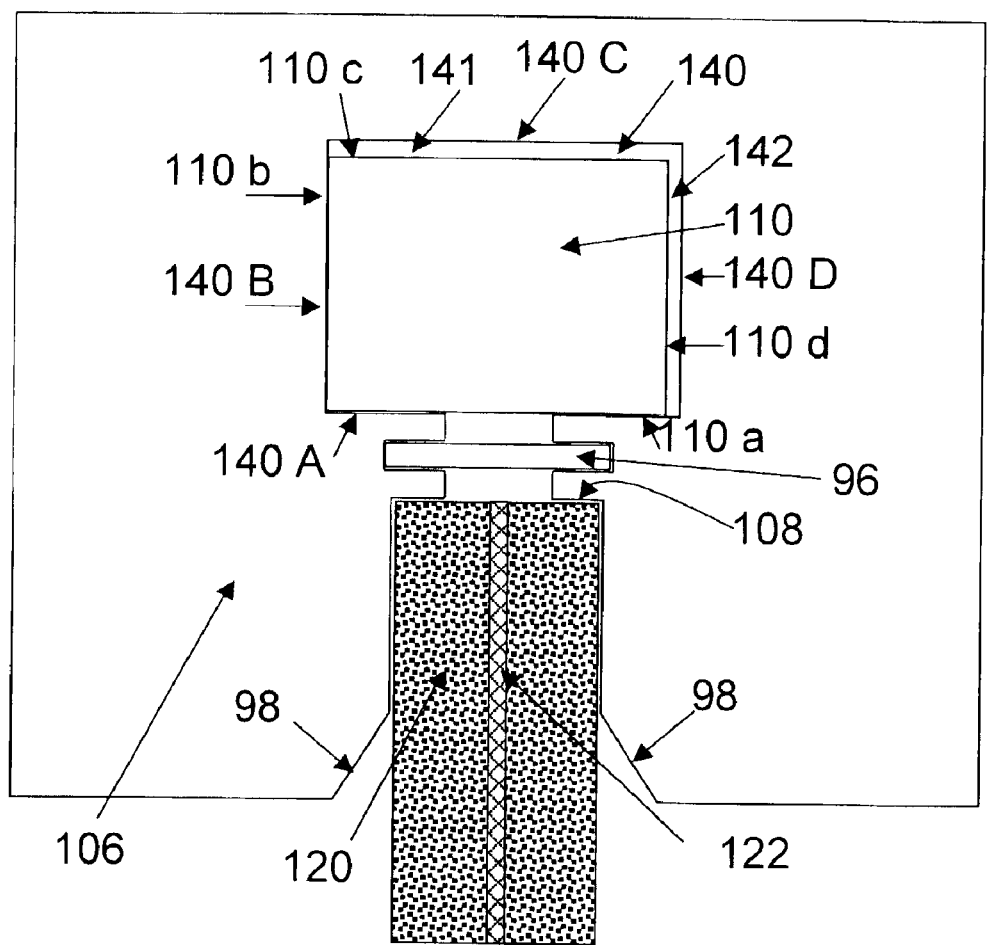
FIG. 6 is a top view of another embodiment of the optoelectronic assembly.

Referring to FIG. 6, in another embodiment the polymer layer 106 is configured to form a chamfer 98 for receiving the fiber 120. Furthermore, additional optical elements such as a lens 96 may be integrated in the assembly. The lens 96 focuses the light signal from the optical fiber cable 122 to the active surface 112 of the device 110 and the reverse. The polymer layer 106 is configured to receive the lens 96. Similarly, a mirror (not shown) may be integrated in FIG. 5 at the edge 92 for deflecting the light toward the waveguide 105.

Several embodiments of the present invention have been described. Nevertheless, it will be understood that various modifications may be made without departing from the spirit and scope of the invention. Accordingly, other embodiments are within the scope of the following claims.

What is claimed is:

1. An optoelectronic assembly for coupling an optical conductor to a light emitting surface of an optoelectronic semiconductor device comprising:
   a multilayer substrate comprising a cavity adapted to receive and electrically connect said optoelectronic semiconductor device to said multilayer substrate, and a first set of patterned layers, and wherein said first set of patterned layers comprise at least one metal layer, at least one dielectric layer and a plurality of passive electrical components embedded within said patterned layers and being connected to each other and to said metal layer thereby forming an electrical network;
   a groove leading to said cavity and being adapted to receive and optically connect said optical conductor to said light emitting surface of said optoelectronic semiconductor device; and
   wherein said optoelectronic semiconductor device and said optical conductor are precisely positioned within said cavity and said groove, respectively, so that light emitted from said light emitting surface of said optoelectronic semiconductor device couples to an optical surface of said optical conductor.

2. The optoelectronic assembly of claim 1 wherein said multilayer substrate further comprises a second set of patterned layers formed upon said first set of patterned layers, wherein said second set of patterned layers comprise at least one polymeric layer and wherein said polymeric layer comprises said cavity and said groove.

3. The optoelectronic assembly of claim 2 wherein said polymeric layer has a height in the range between 30 micrometers and 150 micrometers.

4. The optoelectronic assembly of claim 1 wherein said cavity comprises a first opening formed in a cavity wall and wherein said optoelectronic semiconductor device is oriented and positioned within said cavity so that light emitted from said light emitting surface exits said cavity via said first opening.

5. The optoelectronic assembly of claim 4 wherein said groove comprises a second opening formed in a groove wall, and wherein said second opening is aligned with said first opening, thereby allowing light exiting said cavity through said first opening to couple to an optical surface of said optical conductor aligned with said second opening.

6. The optoelectronic assembly of claim 5 wherein said cavity wall comprising said first opening is spaced apart from said groove wall comprising said second opening at a predetermined distance.

7. The optoelectronic assembly of claim 6 wherein said cavity wall comprising said first opening is spaced apart from said groove wall comprising said second opening at a predetermined distance by placing a second spacer between said cavity wall and said groove wall, wherein said second spacer comprises a length equal to said predetermined distance.

8. The optoelectronic assembly of claim 7 wherein said second spacer comprises a polymer.

9. The optoelectronic assembly of claim 4 wherein said optoelectronic semiconductor device is precisely positioned within said cavity in X and Y directions by placing two adjacent walls of said device in contact with two adjacent walls of said cavity.

10. The optoelectronic assembly of claim 9 wherein said optoelectronic semiconductor device is further precisely positioned within said cavity in a Z direction by placing a bottom surface of said device upon a bottom surface of said cavity.

11. The optoelectronic assembly of claim 9 wherein said optoelectronic semiconductor device is further precisely positioned within said cavity in a Z direction at a predetermined height by placing a bottom surface of said device upon a first spacer positioned upon a bottom surface of said cavity, wherein said spacer comprises said predetermined height.

12. The optoelectronic assembly of claim 11 wherein said first spacer comprises a polymer.

13. The optoelectronic assembly of claim 1 wherein said optoelectronic semiconductor device is selected from a group consisting of laser diodes, light emitting diodes, photodiodes and detectors.

14. The optoelectronic assembly of claim 1 wherein said optical conductor is selected from a group consisting of optical fibers, optical waveguides, lenses, mirrors, gratings, diffraction elements, and combinations thereof.

15. The optoelectronic assembly of claim 1 wherein said first set of patterned layers has a height in the range between 10 micrometers and 25 micrometers.

16. The optoelectronic assembly of claim 1 wherein said optoelectronic semiconductor device is flip chip mounted within said cavity.

17. The optoelectronic assembly of claim 1 wherein said optoelectronic semiconductor device is wire bonded within said cavity.

18. The optoelectronic assembly of claim 1 wherein said cavity comprises at least one metal contact wherein said at least one metal contact is in contact with said metal layer and with said optoelectronic semiconductor device thereby electrically connecting said optoelectronic semiconductor device to said metal layer.

19. A method of coupling an optical conductor to a light emitting surface of an optoelectronic semiconductor device comprising:

providing a multilayer substrate comprising first and second sets of patterned layers, wherein said first set of patterned layers comprise at least one metal layer and at least one dielectric layer and said second set of patterned layers comprises at least one polymeric layer wherein a plurality of passive electrical components embedded within said first set of patterned layers;

forming a cavity within said at least one polymeric layer, wherein said cavity is adapted to receive and electrically connect said optoelectronic semiconductor device to said metal layer;

forming a groove within said polymeric layer, wherein said groove leads to said cavity and is adapted to receive and optically connect said optical conductor to said light emitting surface of said optoelectronic semiconductor device; and precisely positioning said optoelectronic semiconductor device and said optical conductor within said cavity and said groove, respectively, so that light emitted from said light emitting surface of said optoelectronic semiconductor device couples to an optical surface of said optical conductor.

20. The method of claim 19 further comprising forming a first opening in a cavity wall and positioning said optoelectronic semiconductor device within said cavity so that light emitted from said light emitting surface exits said cavity via said first opening.

21. The method of claim 20 further comprising forming a second opening in a groove wall, wherein said second opening is aligned with said first opening, thereby allowing light exiting said cavity through said first opening to couple to an optical surface of said optical conductor aligned with said second opening.

22. The method of claim 21 further comprising placing apart said cavity wall comprising said first opening from said groove wall comprising said second opening at a predetermined distance.

23. The method of claim 22 wherein said cavity wall comprising said first opening is placed apart from said groove wall comprising said second opening at a predetermined distance by forming a second spacer between said cavity wall and said groove wall, wherein said second spacer comprises a length equal to said predetermined distance.

24. The method of claim 19 wherein said precise positioning of said optoelectronic semiconductor device within said cavity in X and Y directions comprises placing two adjacent walls of said device in contact with two adjacent walls of said cavity.

25. The method of claim 24 wherein said precise positioning of said optoelectronic semiconductor device within said cavity in a Z direction comprises placing a bottom surface of said device upon a bottom surface of said cavity.

26. The method of claim 24 wherein said precise positioning of said optoelectronic semiconductor device within said cavity in a Z direction at a predetermined height comprises placing a bottom surface of said device upon a first spacer formed upon a bottom surface of said cavity, wherein said spacer comprises said predetermined height.

27. The method of claim 19 wherein said first set of patterned layers has a height in the range between 10 micrometers and 25 micrometers.

28. The method of claim 19 wherein said polymeric layer has a height in the range between 30 micrometers and 150 micrometers.

29. The method of claim 19 wherein said optoelectronic semiconductor device is flip chip mounted within said cavity.

30. The method of claim 19 wherein said optoelectronic semiconductor device is wire bonded within said cavity.

31. The method of claim 19 further comprising forming at least one metal contact within said cavity wherein said at least one metal contact is in contact with said metal layer and with said optoelectronic semiconductor device thereby electrically connecting said optoelectronic semiconductor device to said metal layer.

32. The method of claim 19 wherein said optoelectronic semiconductor device is selected from a group consisting of laser diodes, light emitting diodes, photodiodes and detectors.

33. The method of claim 19 wherein said optical conductor is selected from a group consisting of optical fibers, optical waveguides, lenses, mirrors, gratings, diffraction elements, and combinations thereof.

* * * * *